US007622849B2

(12) United States Patent
Watanabe et al.

(10) Patent No.: US 7,622,849 B2
(45) Date of Patent: Nov. 24, 2009

(54) ULTRASONIC SENSOR HAVING VIBRATOR MOUNTED ON SUBSTRATE

(75) Inventors: Kazuaki Watanabe, Nagoya (JP); Takahiko Yoshida, Okazaki (JP); Makiko Sugiura, Hekinan (JP); Noboru Endoh, Anjo (JP); Yasuyuki Okuda, Aichi-gun (JP)

(73) Assignee: Denso Corporation, Kariya (JP)

( * ) Notice: Subject to any disclaimer, the term of this patent is extended or adjusted under 35 U.S.C. 154(b) by 440 days.

(21) Appl. No.: 11/712,511

(22) Filed: Mar. 1, 2007

(65) Prior Publication Data

US 2007/0204697 A1 Sep. 6, 2007

(30) Foreign Application Priority Data

Mar. 6, 2006 (JP) ............................. 2006-059413

(51) Int. Cl.
*H01L 41/07* (2006.01)

(52) U.S. Cl. ....................................... 310/334; 310/327

(58) Field of Classification Search ................. 310/322, 310/327, 334, 338
See application file for complete search history.

(56) References Cited

U.S. PATENT DOCUMENTS 3,283,264 A * 11/1966 Papadakis ................... 333/133
3,362,501 A * 1/1968 Lenahan ..................... 181/141
4,081,626 A 3/1978 Muggli et al.
6,772,490 B2 * 8/2004 Toda ......................... 29/25.35
7,190,105 B2 * 3/2007 Deserno et al. ............. 310/322
7,321,181 B2 * 1/2008 Khuri-Yakub et al. ....... 310/320

FOREIGN PATENT DOCUMENTS

| | | |
|---|---|---|
| JP | A-3-112300 | 5/1991 |
| JP | A-10-314672 | 12/1998 |
| JP | A-2002-058097 | 2/2002 |
| JP | A-2005/039720 | 2/2005 |

* cited by examiner

*Primary Examiner*—Thomas M Dougherty
(74) *Attorney, Agent, or Firm*—Posz Law Group, PLC

(57) ABSTRACT

An ultrasonic sensor composed of a substrate and a piezoelectric vibrator mounted on the substrate is advantageously used as a sensor for detecting a distance to an object located in front of an automotive vehicle. Ultrasonic waves transmitted from the sensor are reflected by the object, and the reflected waves are received by the sensor. Based on the reflected waves, the distance from the vehicle to the object is calculated. To reduce rigidity and thereby to lower a resonant frequency of the substrate to a desirable level, grooves are formed in the substrate. A thickness of the substrate is not reduced to maintain its mechanical strength against an impact force. A resonant frequency which is desirable to realize a sufficiently high directivity and sensitivity is obtained in this manner without enlarging a size of the ultrasonic sensor.

11 Claims, 7 Drawing Sheets

ULTRASONIC SENSOR HAVING VIBRATOR MOUNTED ON SUBSTRATE

CROSS-REFERENCE TO RELATED APPLICATION

This application is based upon and claims benefit of priority of Japanese Patent Application No. 2006-59413 filed on Mar. 6, 2006, the content of which is incorporated herein by reference.

BACKGROUND OF THE INVENTION

1. Field of the Invention

The present invention relates to an ultrasonic sensor having an ultrasonic vibrator mounted on a substrate.

2. Description of Related Art

An ultrasonic sensor having a piezoelectric vibrator mounted on a substrate made of such as a metallic material or a resin material has been known hitherto. The ultrasonic sensor is mounted on an automotive vehicle, and ultrasonic waves are emitted from the ultrasonic sensor toward objects in front of or around the vehicle. The objects are detected based on the ultrasonic waves reflected by the objects and received by the ultrasonic sensor. A distance to the objects and two-dimensional or three-dimensional shapes of the objects are detected in this manner.

An example of this type of ultrasonic sensor is disclosed in JP-A-2002-58097. A relevant portion of this ultrasonic sensor is shown in FIG. 8 attached hereto. A cylindrical aluminum case 119 is connected to a vehicle body member 120, and an ultrasonic sensor 110 including an ultrasonic vibrator 111 made of a piezoelectric element mounted on a substrate 112 is supported by the cylindrical aluminum case 119. The vibrator 111 is mounted on a first surface of the substrate 112, and a second surface opposite to the first surface of the substrate 112 faces a front side of the vehicle toward which the ultrasonic waves are transmitted. Ultrasonic waves reflected from an object located in front of the vehicle are received by the substrate 112 and converted into electrical signals by the vibrator 111.

Since the ultrasonic sensor is mounted on a vehicle at a position visible from outside, it is required to make it as small as possible not to destroy an ornamental design of the vehicle. However, there has been a problem that a resonant frequency of the substrate 112 becomes higher as its size becomes smaller. This results in increase in attenuation of the ultrasonic waves and worsening in directivity. It is possible to lower the resonant frequency by reducing rigidity of the substrate. For this purpose, it is conceivable to make the substrate thinner or to use a material having a lower Young's modulus. However, a strength of the substrate against an impact force is considerably reduced by reducing the rigidity of the substrate.

SUMMARY OF THE INVENTION

The present invention has been made in view of the above-mentioned problem, and an object of the present invention is to provide a compact ultrasonic sensor, in which the resonant frequency is lowered while maintaining a mechanical strength against an impact force.

The ultrasonic sensor according to the present invention includes a substrate made of a material such as resin and a vibrator composed of a piezoelectric element mounted on the substrate. The ultrasonic sensor may be mounted on an automotive vehicle to detect objects positioned in front of or around the vehicle. The vibrator is vibrated by electrical signals fed thereto, and the vibrations of the vibrator are transferred to the substrate that transmits ultrasonic waves toward objects positioned in front of or around the vehicle. Ultrasonic waves reflected by the objects are received by the substrate and converted into electrical signals by the vibrator. A distance to an object from the vehicle, for example, is detected based on the reflected ultrasonic waves.

The vibrator is connected to a first surface of the substrate with adhesive, and grooves open to a second surface are formed in the substrate to reduce rigidity of the substrate. By reducing the rigidity of the substrate, its resonant frequency is lowered to a level that is desirable to obtain high directivity and sensitivity, without reducing a thickness of the substrate or enlarging its surface area. Since the thickness of the substrate is not reduced, mechanical strength of the substrate against an impact force is not reduced.

Dead-ended holes may be formed in place of or in addition to the grooves. The grooves may be formed on the first surface on which the vibrator is mounted. In this case, it is preferable not to form the grooves in an area on which the vibrator is connected in order to increase the connecting force of the vibrator to the substrate. The grooves may be formed on both surfaces. The grooves may be formed in a lattice arrangement so that the mechanical strength of the substrate becomes uniform in every direction. Through-holes may be formed in the substrate in place of or in addition to the grooves. Cutout portions may be additionally formed along side surfaces of the substrate to further reduce the rigidity of the substrate. The grooves may be filled with filler having rigidity lower than that of the substrate to prevent foreign particles from entering into the grooves.

According to the present invention, the resonant frequency of the substrate can be lowered to a desirable level without sacrificing the mechanical strength of the substrate and without enlarging a surface area of the substrate. Other objects and features of the present invention will become more readily apparent from a better understanding of the preferred embodiment described below with reference to the following drawings.

DETAILED DESCRIPTION OF THE PREFERRED EMBODIMENT

Figure 1A:
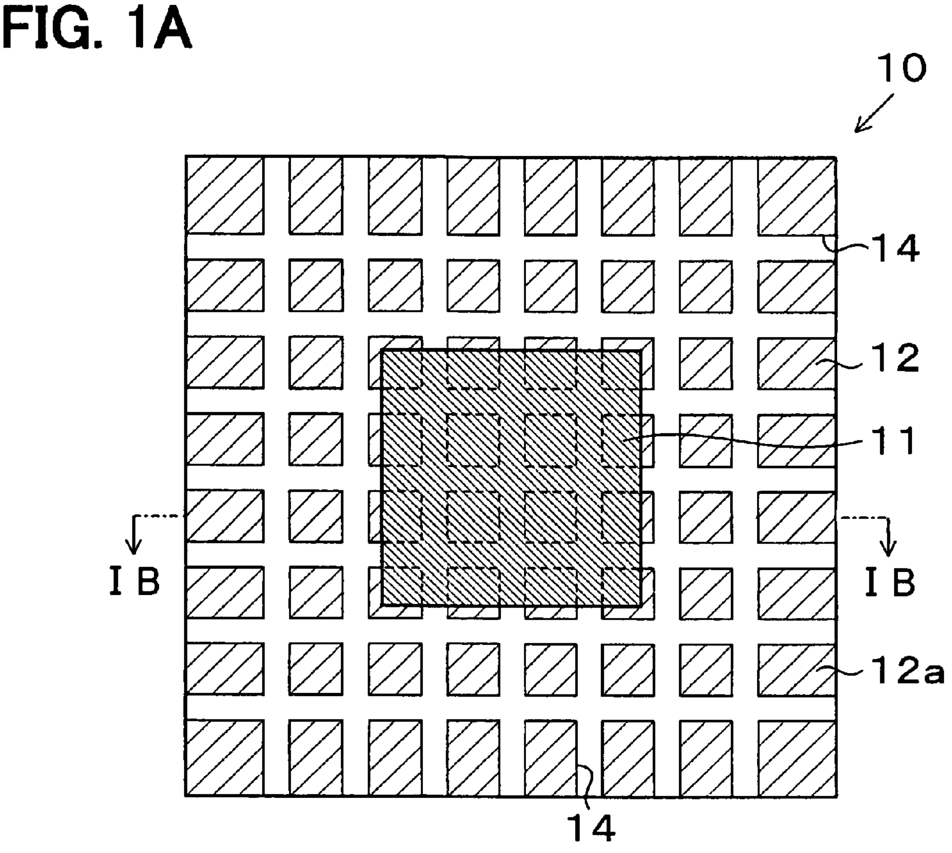
FIG. 1A is a plan view showing an ultrasonic sensor according to the present invention, viewed from a first surface of a substrate on which a vibrator is mounted.
Figure 1B:
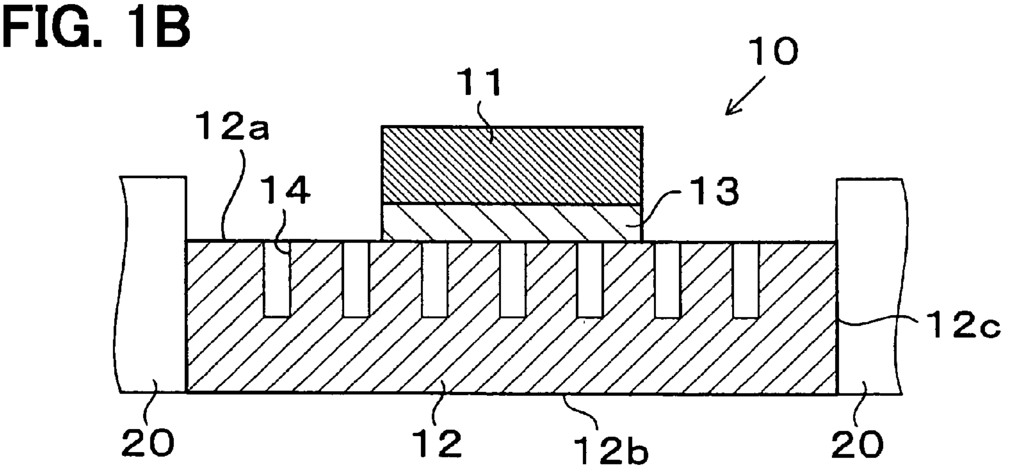
FIG. 1B is a cross-sectional view showing the ultrasonic sensor, taken along line 1B-1B shown in FIG. 1A.

A preferred embodiment of the present invention will be described with reference to accompanying drawings. As shown in FIGS. 1A and 1B, an ultrasonic sensor 10 includes an ultrasonic vibrator 11 that generates and detects ultrasonic waves and a substrate 12. The ultrasonic vibrator 11 is made of a piezoelectric element such as lead-zirconate-titanate (PZT). The piezoelectric element is sandwiched with a pair of electrodes, forming the ultrasonic vibrator 11 having a thickness of 0.1 mm and a plane area of 1 mm×1 mm. Since PZT has a high piezoelectric coefficient, ultrasonic waves in a high level can be generated, and ultrasonic waves in a low level can be received.

The substrate 12 is made of a resin material such as engineering plastics and formed in a square plate having a thickness of 0.5 mm and a plane area of 3 mm×3 mm. The resin material can be easily shaped into the substrate 12 at a low cost by molding or machining. The ultrasonic vibrator 11 is connected to a center portion of a first surface 12*a* of the substrate 12 with adhesive 13. The ultrasonic sensor 10 is fixed to a vehicle body member 20 at a predetermined position, so that the first surface 12*a* of the substrate 12 faces the inside of the vehicle and the second surface 12*b* faces the outside of the vehicle. The substrate 12 may be made of a material other than resin such as a semiconductor material or glass. In the case where the semiconductor material is used, other electronic elements may be formed on the substrate by using a known semiconductor manufacturing process.

The substrate is vibrated by the vibrator 11, and ultrasonic waves are transmitted from the substrate 12 toward objects to be detected. Ultrasonic waves reflected by the objects are received by the substrate 12. The objects in front of or around the vehicle are detected based on the reflected ultrasonic waves. The substrate 12 vibrates at a predetermined resonant frequency when the ultrasonic waves reflected by the objects are received. The vibrations of the substrate 12 are converted into electrical signals by the vibrator 11. The electrical signals are fed to an electronic component (not shown) connected to the vibrator 11 and then sent to an outside electronic control unit (ECU). For example, a distance from the vehicle to an object positioned in front of the vehicle is calculated based on a time difference or a phase difference between the transmitted waves and the reflected waves.

When the substrate 12 is made of a resin plate having a thickness of 0.5 mm, which is necessary to secure a sufficient mechanical strength against impact, a plane area of about 5 mm×5 mm is necessary to obtain a resonant frequency of around several-tens kHz. It is generally difficult to lower the resonant frequency without reducing the thickness of the substrate 12 or enlarging its surface area. It is possible, however, to lower the resonant frequency by reducing the rigidity of the substrate 12 because the resonant frequency is proportional to a square root of the rigidity. In the present invention, the rigidity of the substrate is reduced without changing its thickness and plane size in the following manner.

As shown in FIGS. 1A and 1B, grooves 14 are formed on the first surface 12*a* of the substrate 12 in a lattice arrangement. A width of the groove 14 is 0.1 mm, its depth is 0.25 mm (a half of the thickness) and an interval between neighboring grooves is 0.1 mm. The rigidity of the substrate 12 can be considerably reduced in this manner without changing its thickness, and accordingly the resonant frequency is reduced from 120 kHz to 60 kHz. A cross-sectional shape of the groove 14 is not limited to a rectangular shape, but it may be a half-circular shape or a wedge shape.

Since the grooves 14 are made in a lattice arrangement to uniformly cover an entire first surface 12*a* of the substrate 12, the mechanical strength against impact can be made uniform in every direction. The vibrations of the vibrator 11 become larger because the grooves 14 are also formed under the vibrator 11. Since no grooves are formed on the second surface 12*b*, the ultrasonic waves are smoothly transmitted therefrom and received thereby without causing attenuation.

Figure 2A:
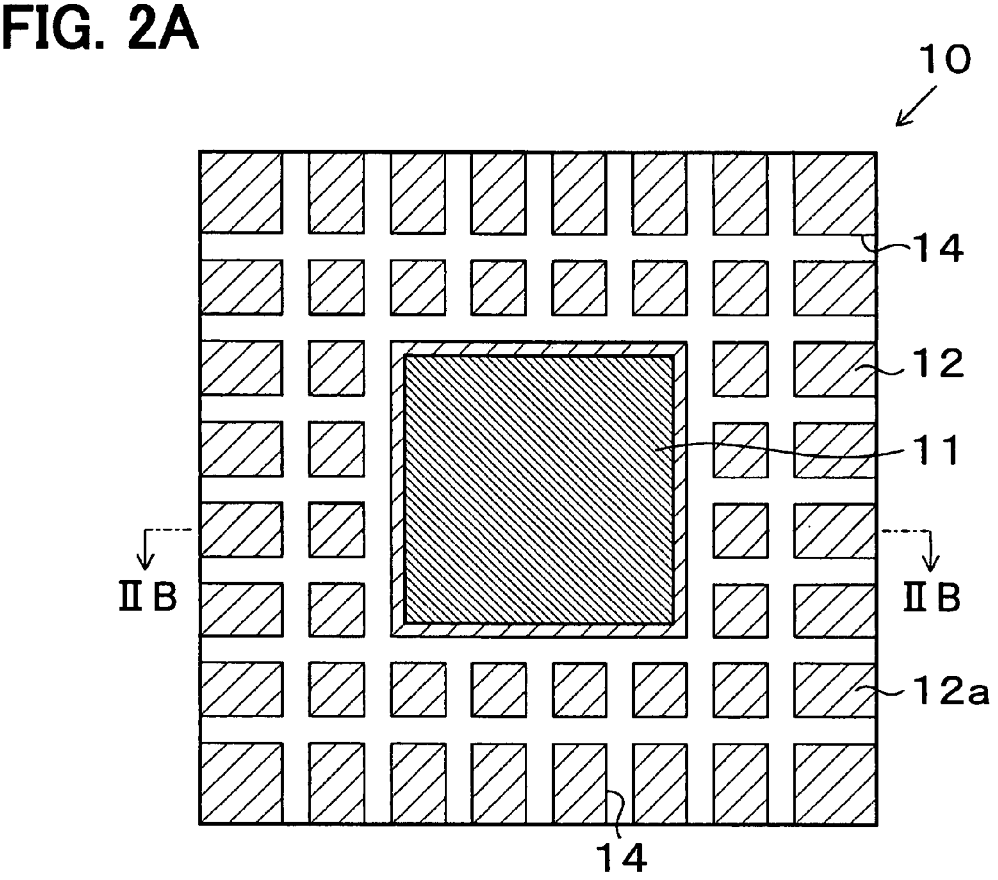
FIG. 2A is a plan view showing a modified form of the ultrasonic sensor, viewed from a first surface of a substrate on which a vibrator is mounted.
Figure 2B:
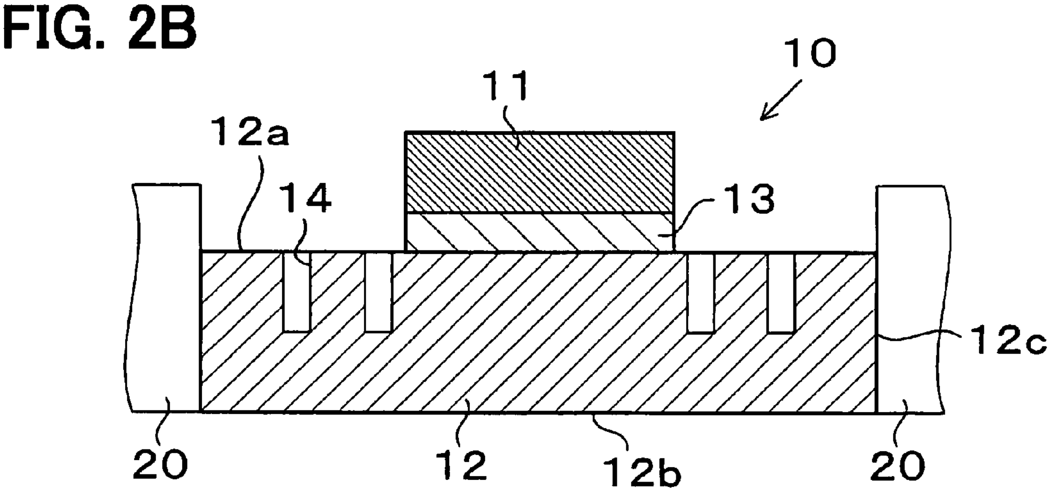
FIG. 2B is a cross-sectional view showing the modified form of the ultrasonic sensor, taken along line IIB-IIB shown in FIG. 2A.
Figure 3A:
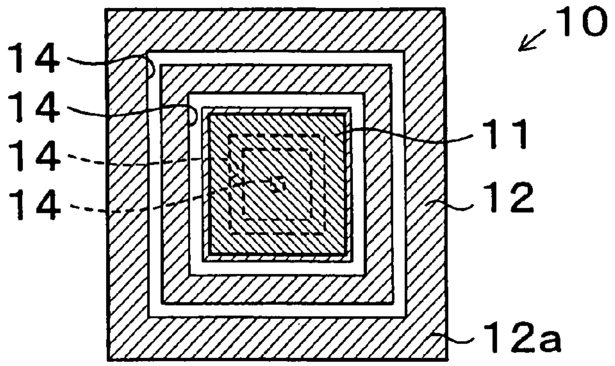
FIGS. 3A-3D show variously modified forms of the ultrasonic sensor shown in FIG. 1A.
Figure 3B:
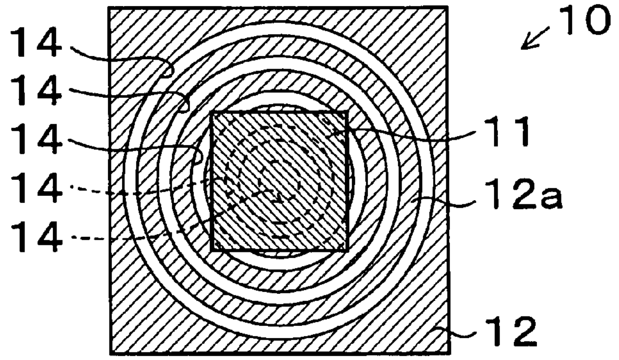
Figure 3C:
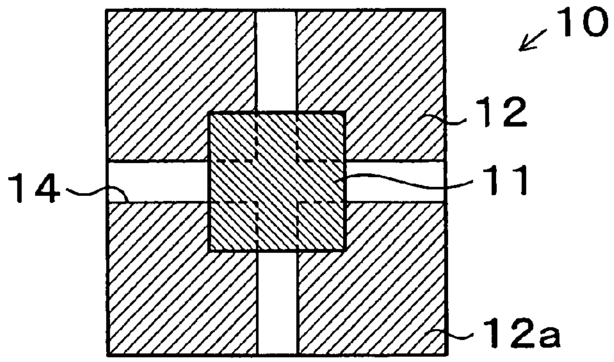
Figure 3D:
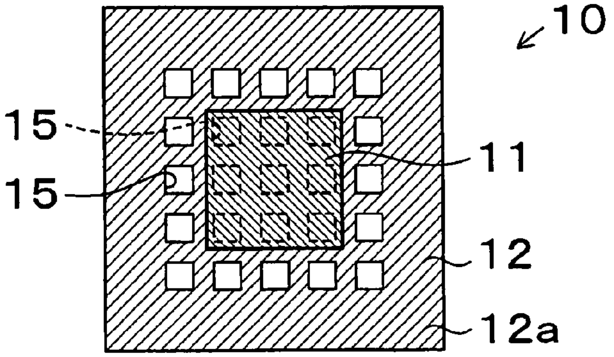

The embodiment shown in FIGS. 1A and 1B may be modified to a form shown in FIGS. 2A and 2B. In this modified form, the grooves 14 are not formed on the first surface 12*a* at a position where the vibrator 11 is connected. The vibrator 11 is more firmly connected to the first surface 12*a*, and attenuation of ultrasonic waves at a boundary between the vibrator 11 and the first surface 12*a* can be made smaller.

Further, the embodiment shown in FIGS. 1A and 1B may be modified to forms shown in FIGS. 3A-3D. In the modified form shown in FIG. 3A, the grooves are formed in a square-shape around the center of the substrate 12. In the modified form shown in FIG. 3B, grooves 14 are formed in a circular shape around the center of the substrate 12. In the modified form shown in FIG. 3C, a pair of grooves 14 is formed to cross each other at the center of the substrate 12. In the modified form shown in FIG. 3D, plural holes 15 open to the first surface 12*a* are formed in place of the grooves 14. Each hole has a plane area of 0.1 mm×0.1 mm, and a depth of 0.25 mm (a half of the thickness of the substrate 12). Since the holes 15 are uniformly distributed, the mechanical strength against impact is uniform in every direction. Round holes may be made in place of the square holes 15. A cross-sectional shape of the groove 14 (shown in FIGS. 3A-3C) in the thickness direction of the substrate 12 may be arbitrarily chosen, i.e., it may be a half-circular shape or a wedge-shape. The intervals between the grooves 14 and the depth of the grooves 14 or holes 15 may be arbitrarily chosen. Further, grooves 14 and the holes 15 may be formed in combination. It is also possible to eliminate grooves 14 or holes at a position where the vibrator 11 is connected.

In the ultrasonic sensor 10 described above, the resonant frequency of the substrate 12 is lowered by forming grooves 14 or holes 15 thereby to reduce the rigidity. Accordingly, the desirable resonant frequency, e.g., 60 kHz is obtained without enlarging the size of the ultrasonic sensor 10 while maintaining the mechanical strength against impact (i.e., without reducing the thickness). Therefore, the ultrasonic sensor 10 can be manufactured in a compact size at a low cost. In addition, the shape of the substrate 12 is not limited to a square shape, but it may be round, for example.

Figure 4A:
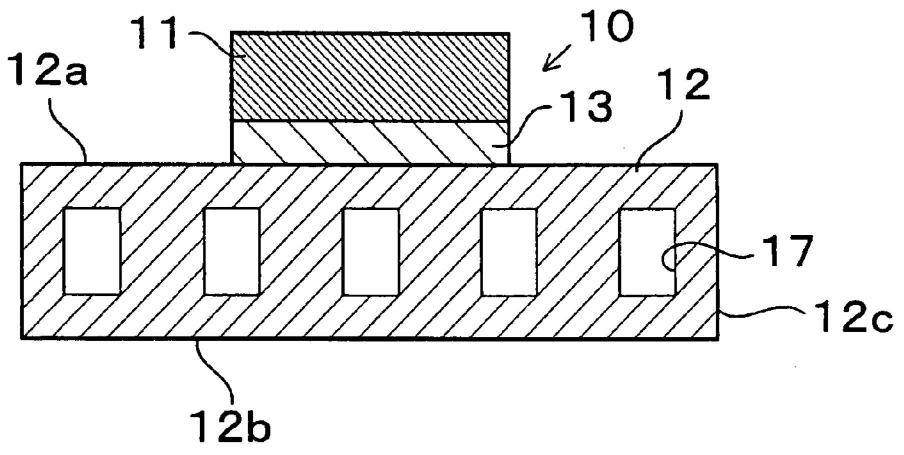
FIGS. 4A-4B show variation 1 of the embodiment of the present invention, in which through-holes are formed in the substrate.
Figure 4B:
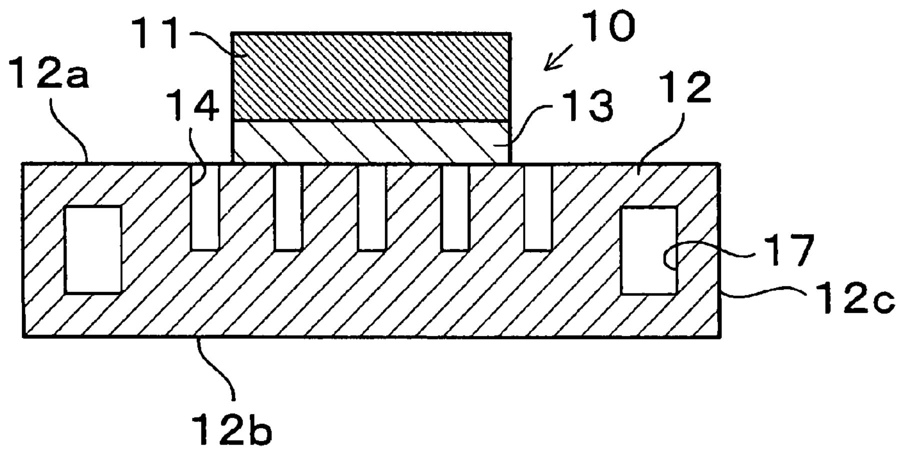

Some of variations of the embodiment described above are shown in FIGS. 4A-7D. Variation 1 is shown in FIGS. 4A and 4B. In FIG. 4A, through-holes 17 extending in parallel to each other are formed through the substrate 12. The through-holes 17 may be formed in a lattice arrangement to cross each other. In FIG. 4B, grooves 14 and through-holes 17 are formed in combination. By making the through-holes 17 and/or the grooves 14 in this manner, the rigidity of the substrate 12 can be reduced to thereby lower the resonant frequency.

Figure 5A:
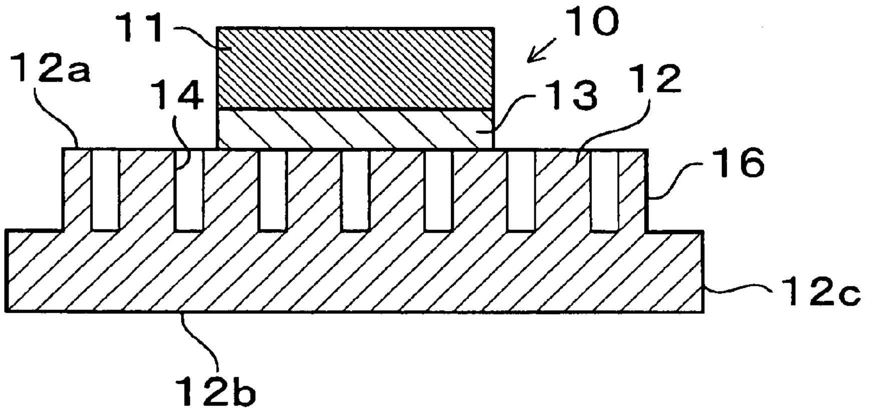
FIGS. 5A-5B show variation 2 of the embodiment of the present invention, in which cutout portions are formed along side surfaces of the substrate.
Figure 5B:
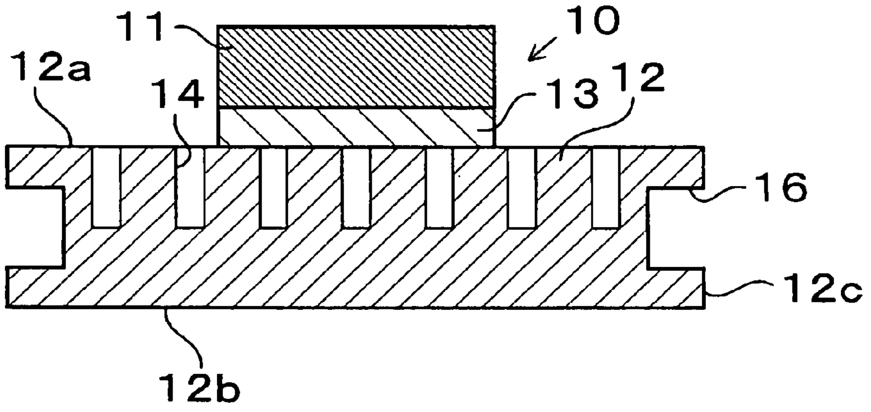

Variation 2 is shown in FIGS. 5A and 5B. In FIG. 5A, L-shaped cutout portions 16 are formed along a side surface 12*c* of the substrate 12 in addition to the grooves 14 formed on the first surface 12*a*. In FIG. 5B, U-shaped cutout portions 16 are formed on the side surface 12*c* in addition to the grooves 14. The cutout portions 16 may be formed on or along only a pair of side surfaces 12*c* or on or along all of the side surfaces 12*c*. The rigidity of the substrate 12 is reduced in this manner, too.

Figure 6:
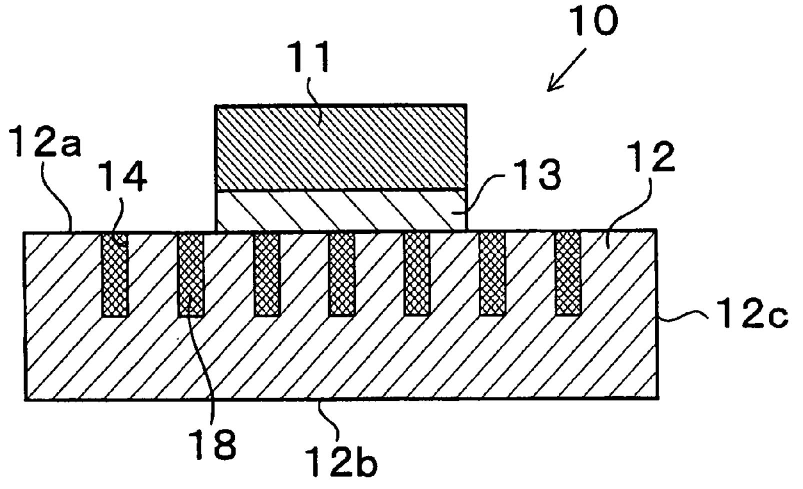
FIG. 6 shows variation 3 of the embodiment of the present invention, in which grooves formed in the substrate are filled with filler.
Figure 8:
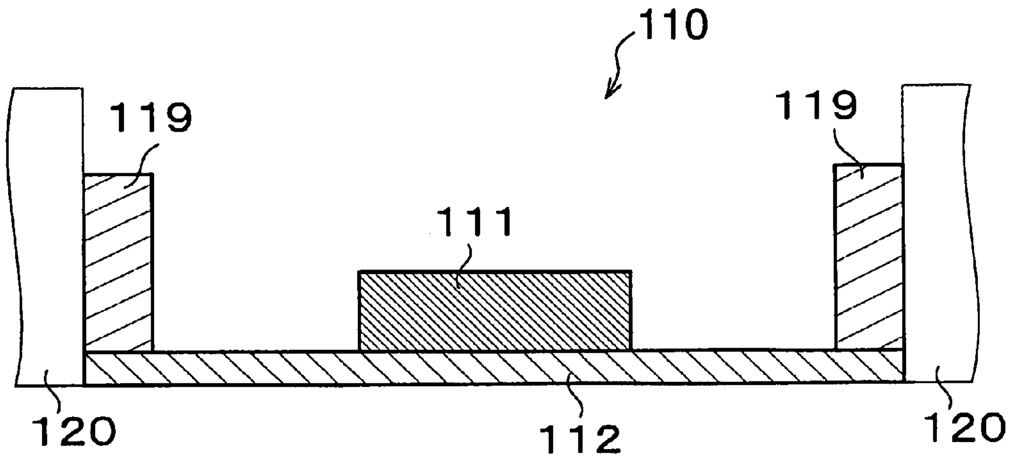
FIG. 8 PRIOR ART
FIG. 8 is a cross-sectional view showing a conventional ultrasonic sensor mounted on a vehicle body member.

Variation 3 is shown in FIG. 6. In the ultrasonic sensor 10 shown in FIG. 6, filler 18 made of a material having a rigidity lower than that of the substrate 12 fills each groove 14. Foreign particles are prevented from entering into grooves 14, and thereby attenuation of ultrasonic waves due to the foreign particles is avoided. Since the rigidity of the filler 18 is lower than that of the substrate 12, an overall rigidity of the substrate 12 is not much affected by the filler 18.

Figure 7A:
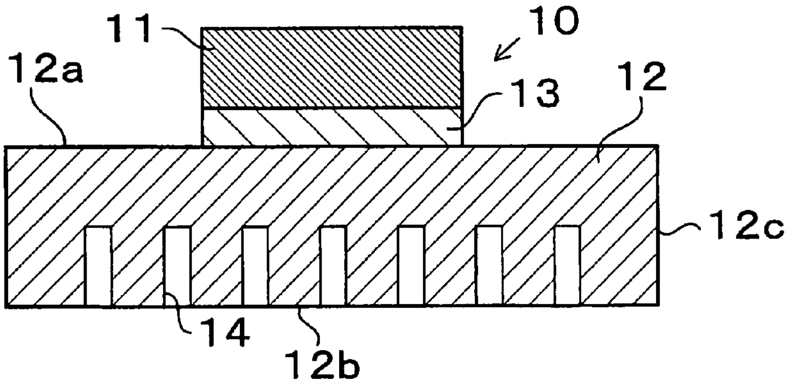
FIGS. 7A-7D show variation 4 of the embodiment of the present invention, in which grooves are formed on the second surface of the substrate.
Figure 7B:
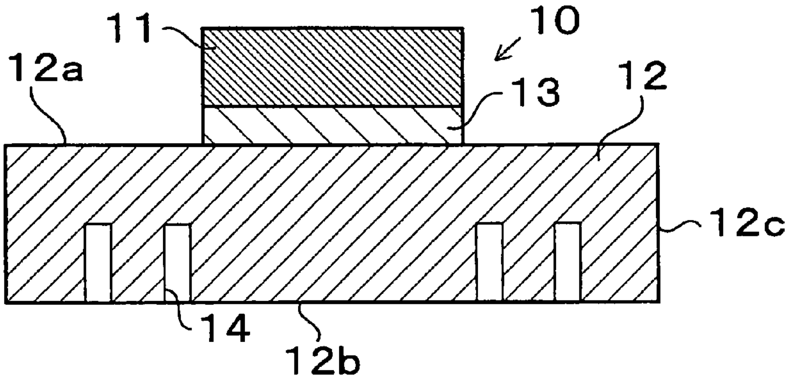
Figure 7C:
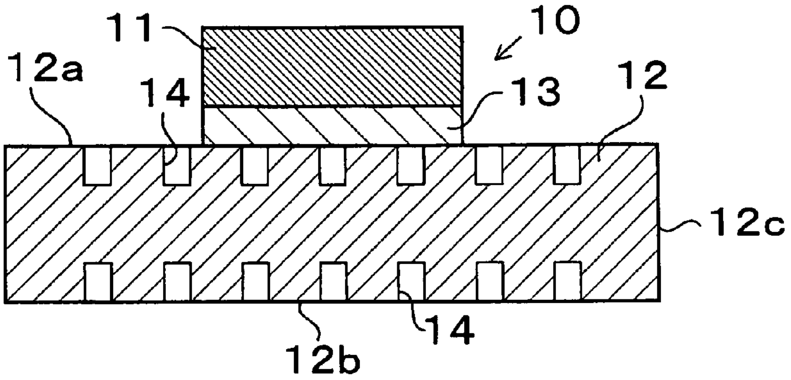
Figure 7D:
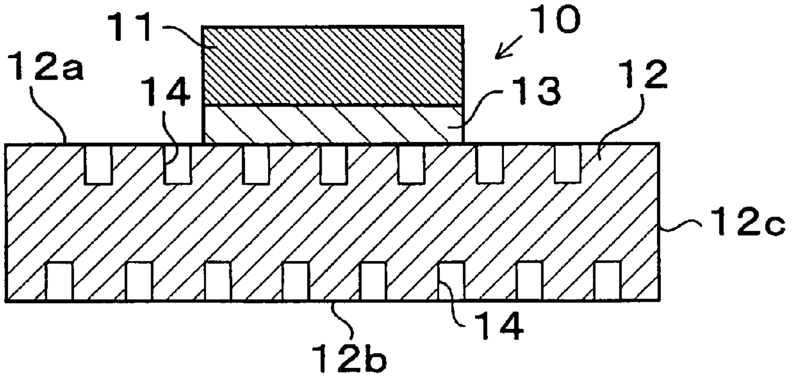

Variation 4 is shown in FIGS. 7A-7D. In the ultrasonic sensor 10 shown in FIG. 7A, the grooves 14 are formed on the second surface 12*b*. The size and shape of the grooves 14 are the same as those shown in FIG. 1B, but they are formed on the second surface 12*b* instead of on the first surface 12*a*. In the ultrasonic sensor 10 shown in FIG. 7B, the grooves 14 are not formed in an area corresponding to the vibrator 11. In the ultrasonic sensor 10 shown in FIG. 7C, the grooves 14 are formed on both surfaces 12*a*, 12*b* of the substrate, but they are a little shallow than those formed only on the second surface 12*b* (FIGS. 7A and 7B). In the ultrasonic sensor 10 shown in FIG. 7D, the grooves 14 are formed on both surfaces 12*a*, 12*b* as in the ultrasonic sensor shown in FIG. 7C. However, the grooves on the second surface 12*b* are arranged in a zigzag relation with respect to the grooves on the first surface 12*a*. The rigidity of the substrate 12 is reduced similarly as in the foregoing embodiment or variations thereof, and accordingly the resonant frequency is reduced.

Advantages attained in the present invention will be summarized below. The rigidity of the substrate can be reduced by forming the grooves 14 or holes 15 in the substrate 12 without reducing the thickness of the substrate. Therefore, the resonant frequency of the substrate 12 can be lowered to a desired level, without enlarging its plane size, while maintaining the mechanical strength of the substrate 12 against an impact force. The grooves 14 and/or the holes 15 are easily formed on the substrate 12, and the resonant frequency is lowered without using additional components.

The rigidity of the substrate 12 can be made uniform in all directions by forming the grooves 14 in a lattice arrangement. The rigidity of the substrate 12 can be further reduced by forming cutouts 16 (as shown in FIGS. 5A and 5B) in addition to the grooves 14. In the case where the grooves 14 are not formed in an area contacting the vibrator 11 (as shown in FIGS. 2A and 2B), the vibrator 11 is more firmly connected with adhesive 13 to the substrate 12 because a contacting area between the substrate 12 and the vibrator 11 is enlarged. Attenuation of the ultrasonic waves at the boundary between the vibrator 11 and the substrate 12 is suppressed at the same time. When the vibrator 11 is connected to the first surface 12*a* and the grooves 14 are formed on the second surface 12*b* (as shown in FIGS. 7A and 7B), the vibrator 11 can be easily and firmly connected to the substrate 12. The attenuation of the ultrasonic waves at the boundary is similarly suppressed.

In the case where the grooves 14 are filled with the filler 18 having a low rigidity (as shown in FIG. 6), foreign particles are prevented from entering into the grooves 14, and reduction in sensitivity of the ultrasonic sensor due to the foreign particles is avoided. Since the rigidity of the filler 18 is lower than that of the substrate 12, an overall rigidity of the substrate 12 is not much affected by the filler 18.

The present invention is not limited to the embodiment and its variations described above, but it may be variously modified. For example, the grooves or the holes may be formed in the vibrator 11 in addition to those formed in the substrate 12. The resonant frequency of the ultrasonic sensor 10 can be further reduced in this manner, and the output of the vibrator 11 can be increased by lowering the rigidity of the vibrator 11 in this manner.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An ultrasonic sensor comprising:

a substrate for transmitting and receiving ultrasonic waves; and a vibrator, mounted on the substrate, for converting electrical signals to the ultrasonic waves to be transmitted and for converting the ultrasonic waves received to electrical signals, wherein:

the vibrator is mounted on a first surface of the substrate; and hollow spaces open to the second surface, opposite to the first surface, are formed in the substrate thereby to reduce rigidity of the substrate.

2. The ultrasonic sensor as in claim 1, wherein the hollow spaces are grooves formed on the second surface.

3. The ultrasonic sensor as in claim 2, wherein the grooves are formed in a lattice arrangement.

4. The ultrasonic sensor as in claim 1, wherein the hollow spaces are holes formed on the second surface.

5. The ultrasonic sensor as in claim 1, wherein cutout portions are formed along side surfaces, perpendicular to the second surface, of the substrate.

6. The ultrasonic sensor as in claim 1, wherein the hollow spaces are filled with filler having a rigidity lower than that of the substrate.

7. The ultrasonic sensor as in claim 1, wherein the vibrator is a piezoelectric element made of lead-zirconate-titanate.

8. The ultrasonic sensor as in claim 1, wherein the substrate is made of a resin material.

9. The ultrasonic sensor as in claim 1, wherein the substrate is made of a semiconductor material.

10. The ultrasonic sensor as in claim 1, wherein the substrate is made of glass.

11. An ultrasonic sensor comprising:

a substrate for transmitting and receiving ultrasonic waves, the substrate having a first surface and a second surface opposite to the first surface; and a vibrator, mounted on the substrate, for converting electrical signals to the ultrasonic waves to be transmitted and for converting the ultrasonic waves received to electrical signals, wherein:

grooves open to the first surface are formed in the substrate thereby to reduce rigidity of the substrate; and the vibrator is mounted on the first surface of the substrate at a position where the grooves are not formed.

* * * * *